(12) United States Patent
Kawasaki

(10) Patent No.: US 6,424,400 B1
(45) Date of Patent: Jul. 23, 2002

(54) DISPLAY PANEL INCLUDING A PRINTED CIRCUIT BOARD HAVING A LARGER OPENING THAN THE OUTSIDE SHAPE OF THE DRIVING IC CHIP

(75) Inventor: Kiyohiro Kawasaki, Hirakata (JP)

(73) Assignee: Matsushita Electric Industrial Co., Ltd. (JP)

(*) Notice: Subject to any disclaimer, the term of this patent is extended or adjusted under 35 U.S.C. 154(b) by 0 days.

(21) Appl. No.: 09/673,357

(22) PCT Filed: Feb. 21, 2000

(86) PCT No.: PCT/JP00/00961

§ 371 (c)(1), (2), (4) Date: Nov. 30, 2000

(87) PCT Pub. No.: WO00/51099

PCT Pub. Date: Aug. 31, 2000

(30) Foreign Application Priority Data

Feb. 25, 1999 (JP) ............................................ 11/047276

(51) Int. Cl.[7] ............................................. G02F 1/1345
(52) U.S. Cl. ...................... 349/149; 349/150; 349/151; 349/152
(58) Field of Search ............................. 349/149, 150, 349/151, 152, 141, 42; 428/901

(56) References Cited

U.S. PATENT DOCUMENTS 5,592,365 A * 1/1997 Sugimoto et al. ........... 174/254
6,144,216 A * 11/2000 Kajiwara et al. ........ 324/158.1
6,320,691 B1 * 11/2001 Ouchi et al. ................ 359/237

FOREIGN PATENT DOCUMENTS

| JP | 3-196181 | 8/1991 |
| JP | 5-181985 | 6/1992 |
| JP | 10-96948 | 4/1998 |
| JP | 10-274779 | 10/1998 |

* cited by examiner

Primary Examiner—William L. Sikes
Assistant Examiner—Tarifur R. Chowdhury
(74) Attorney, Agent, or Firm—Parkhurst & Wendel, LLP

(57) ABSTRACT

A display panel capable of supplying necessary signals and power source at low resistance to a semiconductor integrated circuit chip mounted on a display panel is disclosed. Herein, electric signals are supplied to terminal electrodes of the scanning lines and signal lines by mounting a driving integrated circuit chip directly on the terminal electrode disposed on the active substrate. Further, electric connection to the driving integrated circuit chip is achieved by mounting a printed circuit board having a larger opening than the outside shape of the driving integrated circuit chip and forming wiring lines at the mounting position of the driving integrated circuit chip mounted on the active substrate and its vicinity, on outside of the image display region of the active substrate.

12 Claims, 10 Drawing Sheets

Reference numerals in the drawings

| | |
|---|---|
| 1 | liquid crystal panel |
| 2 | active substrate |
| 3 | semiconductor integrated circuit chip |
| 3a | semiconductor integrated circuit chip |
| 3b | semiconductor integrated circuit chip |
| 4 | TCP film |
| 5a | terminal electrode |
| 5b | terminal electrode |
| 6 | terminal electrode |
| 7a | wiring line |
| 7b | wiring line |
| 8 | wiring line |
| 9 | color filter substrate |
| 10a | common bus line |
| 10b | common bus line |
| 10c | common bus line |
| 11 | bus flexible film |
| 12 | wiring line |
| 13a | print circuit board |
| 13b | print circuit board |
| 14a | opening |
| 14b | opening |
| 15a | recess |
| 15b | recess |
| 16a | connection terminal |
| 16b | connection terminal |
| 17a | connection terminal |
| 17b | connection terminal |
| 18 | flexible connection film |
| 19a | connection terminal |
| 19b | connection terminal |
| 20a | connection terminal |
| 20b | connection terminal |

| | |
|---|---|
| 21 | ACF |
| 22a | bus line |
| 22b | bus line |
| 23 | wiring line |
| 24 | bump electrode |
| 25 | bump electrode |
| 26 | insulation layer |
| 27 | insulation layer |

DISPLAY PANEL INCLUDING A PRINTED CIRCUIT BOARD HAVING A LARGER OPENING THAN THE OUTSIDE SHAPE OF THE DRIVING IC CHIP

TECHNICAL FIELD

The present invention relates to a display panel having an image display function, and a printed circuit board mounted on the display panel.

BACKGROUND ART

Owing to the recent advancement in ultrafine processing technology, liquid crystal material technology, and mounting technology, liquid crystal panels capable of displaying various images such as television images at a practically satisfactory level in diagonal size of 5 to 50 cm are presented on a commercial base.

Besides, color display is easily realized by forming an RGB coloring layer in one of the two glass substrates for composing a liquid crystal panel.

In particular, in a so-called active type liquid crystal panel incorporating switching elements in every pixel, an image of high contrast ratio is obtained in high speed response with less crosstalk.

Such liquid crystal panels are generally composed in a matrix comprising 100 to 1000 scanning lines and 200 to 2000 signal lines, and lately both large screen and high definition are promoted simultaneously in relation to the increase in the display capacity.

FIG. 6 is a perspective view of an active type liquid crystal panel, in which the active type liquid crystal panel is composed of an active substrate 2, a confronting counter substrate 9, and liquid crystal filled between them.

The active substrate 2 has a plurality of scanning lines formed on a principal surface of a transparent insulating substrate, and a plurality of signal lines substantially orthogonal to the scanning lines formed at least across one insulating layer, and at least one switching element and at least one pixel electrode are disposed at every intersection of scanning line and signal line, and a terminal electrode group of the scanning lines and signal lines is disposed outside of the image display region.

The counter substrate 9 is composed of a glass substrate which is a transparent insulating substrate having a transparent conductive counter electrode.

The active substrate 2 and counter substrate 9 are formed across a specific distance of several microns by way of a spacer such as resin fiber or beads, and their gap is a closed space sealed by sealing material and filling material made of organic resin on the peripheral edge of the counter substrate 9, and this closed space is filled with liquid crystal.

In the case of color display, the closed space side of the counter substrate 9 is coated with a coloring layer containing either a dye or a pigment or both, as an organic thin film of about 1 to 2 $\mu$m in thickness, so that a color display function is provided. In this case, the glass substrate 9 is also called a color filter.

Depending on the properties of the liquid crystal material, a polarizing plate is adhered to either the upper surface of the counter substrate 9 or the lower surface of the glass substrate 2, or on both sides, so that the liquid crystal panel 1 functions as an electro-optical element.

In the majority of panels, at the present, the Twisted Nematic (TN) system is used in the liquid crystal, and it requires two polarizing plates.

In thus constituted liquid crystal panel, outside the image display region of the active substrate 2, for example, on the terminal electrode group 6 of scanning lines, a semiconductor integrated circuit chip 3 for supplying drive signals is mounted by direct connecting Chip-On-Glass (COG) system, whereas on the terminal electrode group 5 of signal lines, a Tape-Carrier-Package (TCP) film 4 is mounted by the TCP system of connecting and fixing with a conductive adhesive.

The TCP film 4 has a terminal of copper foil (not shown) of gold plating or solder plating, for example, formed on a polyimide resin thin film of about 0.1 mm in thickness.

Two mounting methods are shown herein, but actually either method is properly selected.

The image display unit of the liquid crystal panel 1, and the terminal electrode groups 5, 6 of signal lines and scanning lines are connected by means of wiring lines 7, 8, but the wiring lines 7, 8 are not always required to be composed of same conductive material as the terminal electrode groups 5, 6.

In this liquid crystal panel, liquid crystal cells are composed of transparent conductive pixel electrodes formed on the active substrate 2, transparent conductive counter electrodes formed on the counter substrate 9, and liquid crystal filled between the two glass substrates.

In the recently developed In-Plain-Switching (IPS) type liquid crystal panel capable of expanding the viewing field angle, the liquid crystal cells are composed of a pair of comb electrodes formed on one glass substrate (active substrate) and the liquid crystal filled between the two glass substrates, and hence the transparent electrode (counter electrode) is not needed on the color filter, but the detail is omitted herein.

To display an image on the liquid crystal panel, an electric signal must be given to the terminal electrodes of the scanning lines and signal lines by TCP or COG mounting as mentioned above. Recently, to save the mounting cost, or to enhance the mounting reliability by decreasing the number of connecting positions, the COG mounting tends to be preferred.

FIG. 7 is a magnified view of essential parts by COG mounting of a driving integrated circuit chip 3 on the active substrate 2, and in the COG mounting, since systems of power source line, input signal line, and clock line scanning to a plurality of driving integrated circuit chips cannot be supplied in each chip as in the TCP mounting, it is needed to form about 20 to 40 conductive bus lines 10 on the peripheral edge of the active substrate 2, but in the digitized signal system, in order to be applicable to high image quality, henceforth, the number of bits tends to increase rapidly.

To form active elements, it is also needed to form scanning lines and signal lines, and these wiring lines can be formed simultaneously with the active elements, which is more rational.

Forming places of wiring lines 10 can be easily insulated by forming an insulation layer on the surface, and, for example, by utilizing the space effectively by disposing wiring lines 10 beneath the integrated circuit chip 3, it may contribute to narrowing of peripheral margin of the liquid crystal panel.

In the COG mounting, however, in the screen diagonal size of 6 (15 cm) or more at which the resistance value of the wiring line 10 is high, as shown in FIG. 8, it is required to use together with a bus flexible film 11.

The bus flexible film 11 is similar to the TCP film 4, that is, a wiring line 12 made of a conductive thick film is formed on a flexible film. Its length is as long as 20 to 50 cm, and the wiring line connecting between parallel lines crosses orthogonally with the parallel lines, and hence it requires several or more multiple layers, which is very expensive, and it is difficult to lower the cost.

Inevitably, however, the bus flexible film 11 is used as explained below.

When manufacturing a active liquid crystal panel, since the film thickness of the conductive lines such as scanning lines and signal lines is about 0.5 $\mu$m, the resistance value of the conductive lines cannot be lowered sufficiently, and the resistance of the wiring lines 10 increases due to the shape effect (ratio of length/width of wiring pattern), and a sufficient current cannot be passed by the bus wiring lines 10 alone. More specifically, for example, by using an aluminum film of about 0.3 $\mu$m in thickness in the wiring line material, if a surface resistance of 0.1 $\Omega/cm^2$ is obtained, in the case of wiring width of 50 $\mu$m and wiring length of 25 $\mu$m, the resistance value of the wiring lines reaches as much as 500$\Omega$, and it is hence difficult to use in the power source lines of mA unit or higher.

Similarly, in the input signal and clock lines, such wiring resistance is added to the input resistance of the semiconductor integrated circuit, and in the case of high speed transfer of signal (more than hundreds of kHz), the signal waveform becomes rounded off, and the semiconductor integrated circuit may fail to work.

DISCLOSURE OF THE INVENTION

The invention is to solve these conventional problems, and is intended to supply necessary signals and power source to the mounted semiconductor integrated circuit chip through wiring lines having a low resistance.

In the invention, an opening or a recess is formed in the mounting position of the driving integrated circuit chip on the printed circuit board which is mounted outside of the image display area of the active substrate, and the wiring lines of low resistance formed on the printed circuit board are used as bus lines.

Therefore, according to the invention, since the resistance value of the bus lines connected to the driving chip can be decreased, the signals can be transmitted at high speed without deforming the signal waveform.

Also according to the invention, wiring lines of low resistance value composed of a thick conductive material formed on the printed circuit board can be used as the bus lines such as power source lines, input signal lines and clock lines, and it is not necessary to use the conventional long bus flexible film.

Further according to the invention, not only the printed circuit board can be mounted on the active substrate, but also the cost is reduced.

Moreover, according to the invention, in a display panel of a particularly large screen size, the printed circuit board can be easily mounted on the active substrate.

DETAILED DESCRIPTION OF PREFERRED EMBODIMENTS

Preferred embodiments of the invention are described below while referring to FIG. 1 to FIG. 5.

Figure 6:
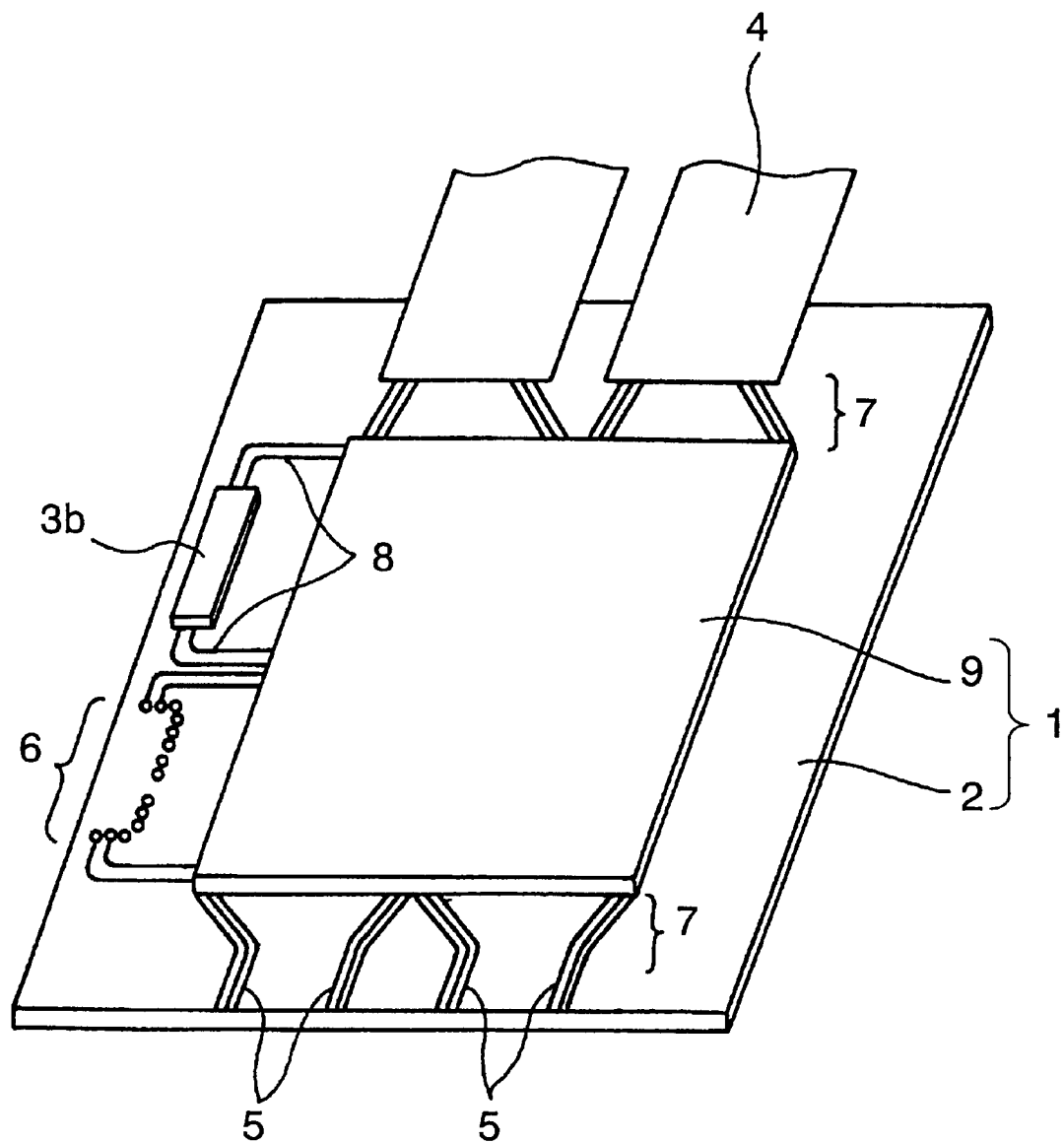
FIG. 6 is a perspective view of a conventional liquid crystal panel.
Figure 7:
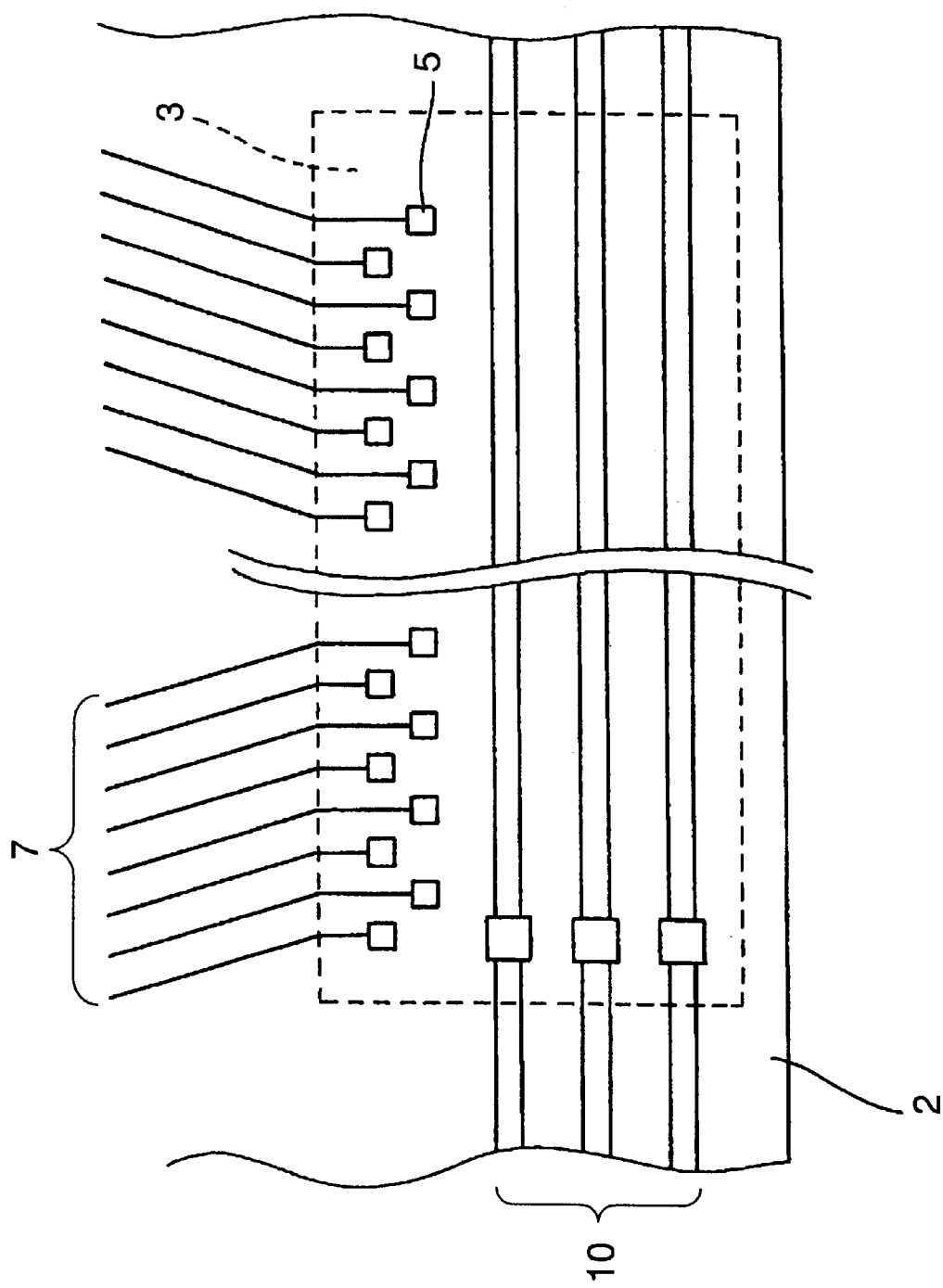
FIG. 7 is an essential magnified view showing the peripheral edge of the liquid crystal panel in COG mounting in a prior art.
Figure 8:
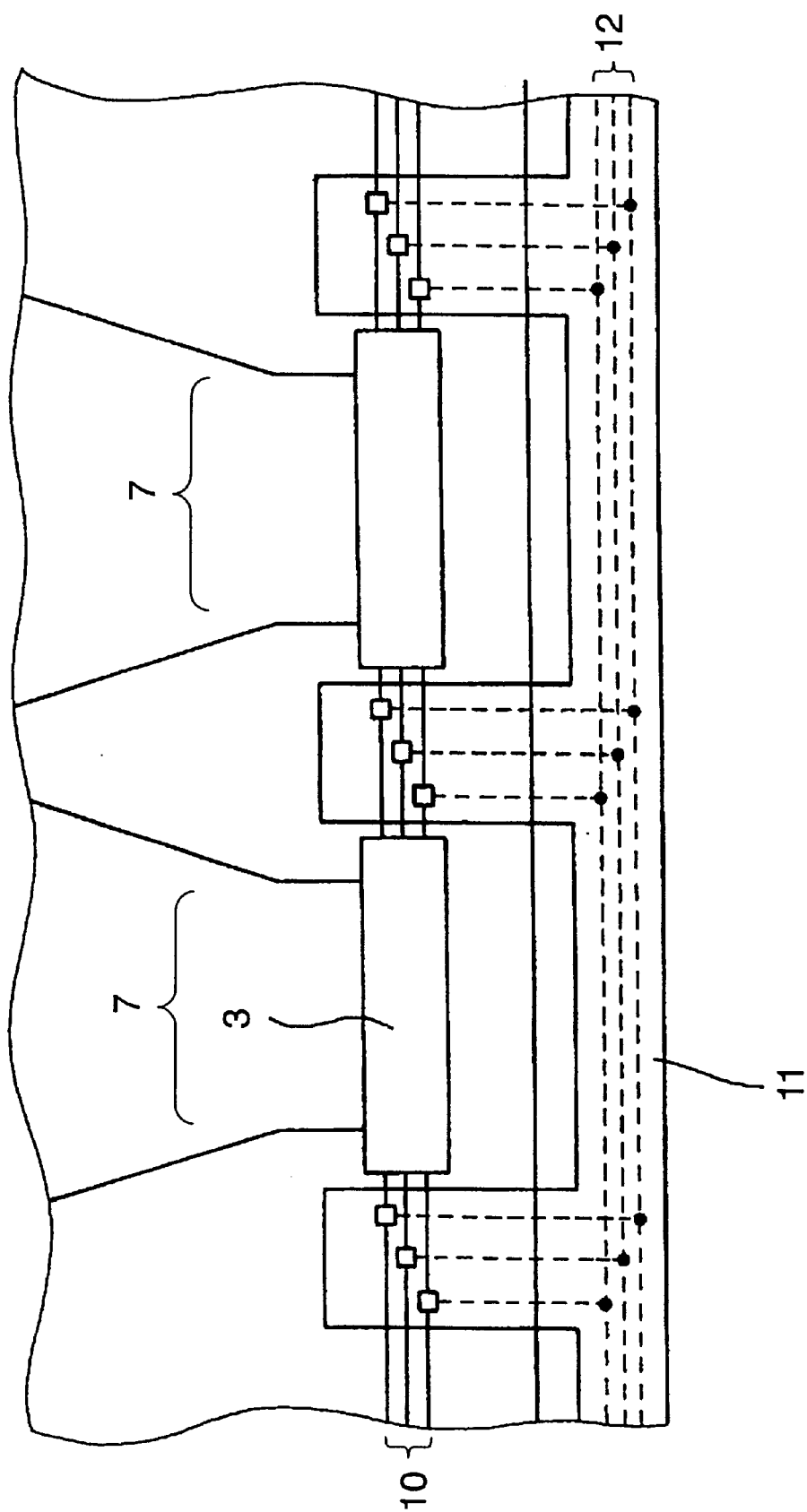
FIG. 8 is an essential magnified view showing the peripheral edge in COG mounting of a large-sized liquid crystal panel using together with a bus flexible film.

The same parts as in FIG. 6 to FIG. 8 are identified with the same reference numerals in the following explanation.

(Embodiment 1)

Figure 1A:
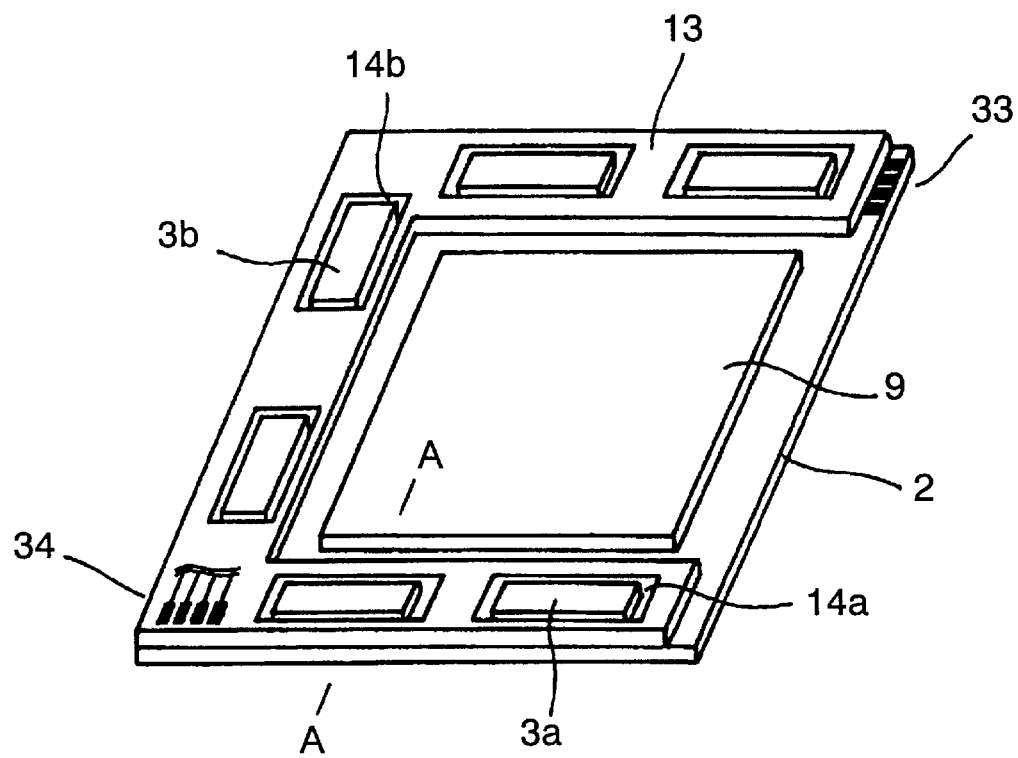
FIG. 1A is a perspective view showing a mounting state on a liquid crystal panel in embodiment 1 of the invention.
Figure 1B:
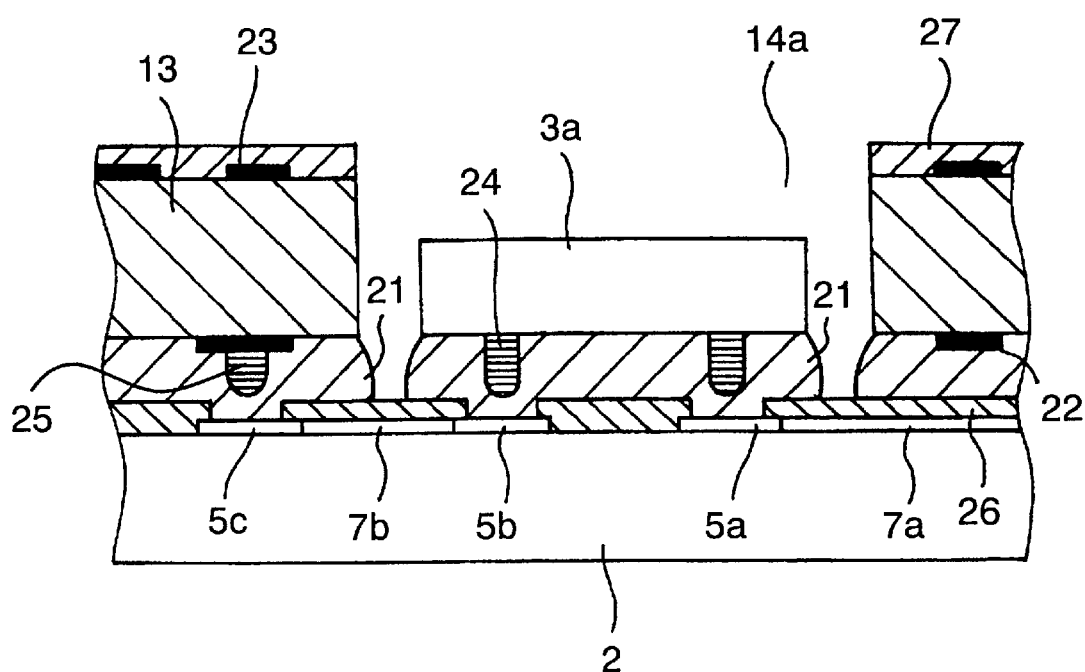
FIG. 1B sectional view along line A—A in FIG. 1A.
Figure 2A:
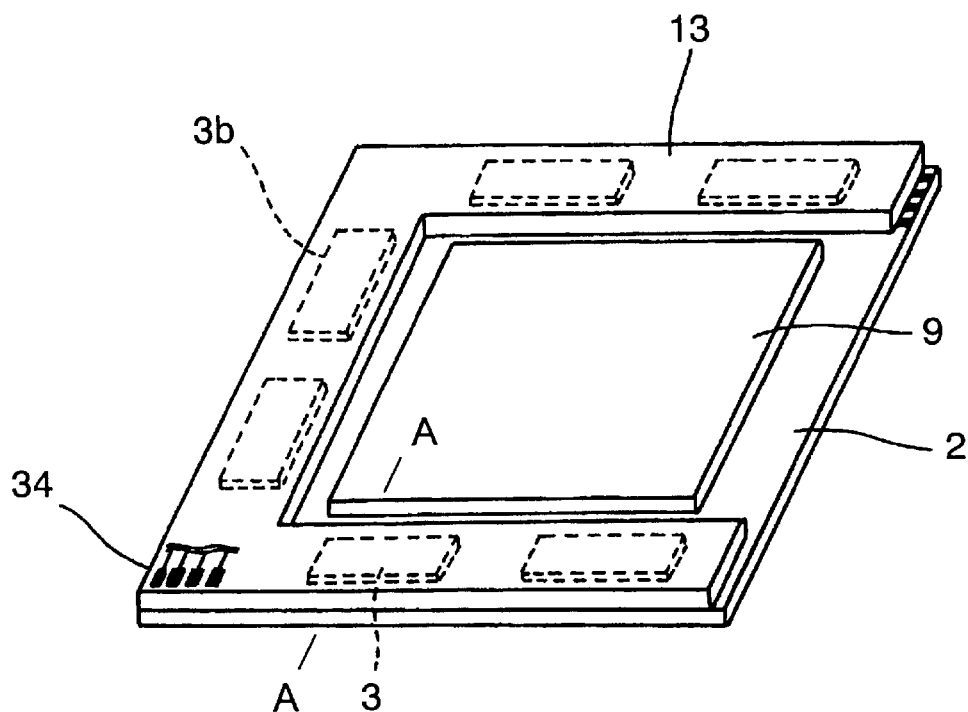
FIG. 2A is a perspective view showing a mounting state of a printed circuit board on a liquid crystal panel in embodiment 2 of the invention.
Figure 2B:
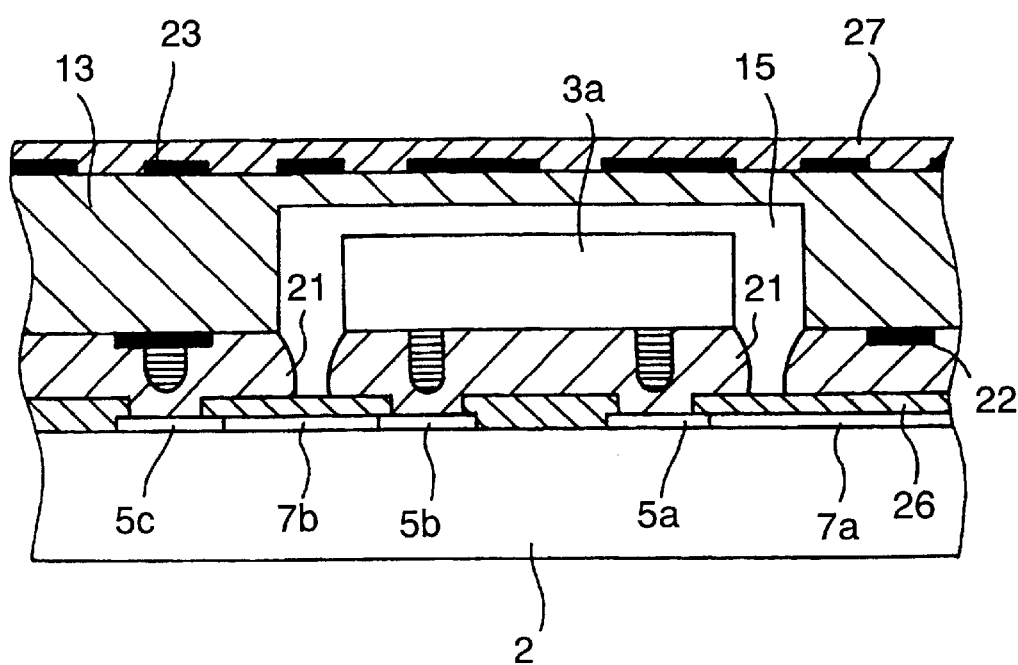
FIG. 2B is a sectional view along line A—A in FIG. 2A.

As shown in FIG. 1A and FIG. 1B, an active substrate 2 comprises a terminal electrode 5a, a wiring line 7a for connecting this terminal electrode 5a with a signal line, and a wiring line 7b for connecting terminal electrodes 5b, 5c.

Preferably, these terminal electrodes 5a, 5b, 5c, and wiring lines 7a, 7b should be formed simultaneously.

An insulation layer 26 includes gate insulation layer, passivation insulation layer, and other insulation layers formed on a principal surface of the active substrate 2, and insulation layers on the upper surface of the terminal electrodes 5a, 5b, 5c are selectively removed, and the surface of the individual electrodes is exposed.

At the mounting surface side of the driving integrated circuit chip 3a connected electrically to the terminal electrodes 5a, 5b, a bump electrode 24 connected electrically to the terminal electrodes 5a, 5b is formed.

In a printed circuit board 13 connected electrically to the terminal electrodes 5a, 5b, 5c and wiring lines 7a, 7b, openings 14a, 14b larger than the outside shape of the integrated circuit chip 3a are formed at positions corresponding to the mounting position of the driving integrated circuit chip 3a mounted on the active substrate 2.

On the upper side of the printed circuit board, a wiring line 23 of low resistance is formed, and an insulation layer 27 is formed thereon for the purpose of protecting this wiring line 23. Herein, the wiring line 23 is formed of a thick conductive material so that its resistance may be low. The insulation layer 27 may be formed either at the time of composing the printed circuit board 13, or after mounting the printed circuit board 13 by applying a proper resin.

Although not shown, an insulation layer may be similarly formed for protecting a wiring line 22 formed at the mounting surface side of the printed circuit board 13.

On the wiring line 22 facing the terminal electrode 5c, a bump 25 is formed for connecting electrically between the terminal electrode 5c and wiring line 22.

The wiring line 22 is a wiring line of low resistance formed on the principal surface facing the active substrate 2, and the wiring line 23 is a wiring line of low resistance formed on a principal surface opposite to the principal surface facing the active substrate 2. The wiring line of low resistance is generally a copper foil with a film thickness of several to tens of microns.

The printed circuit board 13 thus composed is mounted on the active substrate 2, first by mounting driving integrated circuit chips 3a, 3b on the active substrate 2 by means of a thermosetting Anisotropic Conductive Film (ACF) or the like.

The printed circuit board 13 forming openings 14a, 14b at positions corresponding to the mounting positions of the mounted driving integrated circuit chips 3a, 3b is mounted outside of the image area of the active substrate 2.

In this constitution, electric signals are supplied into the terminal electrodes of scanning lines and signal lines by mounting the driving integrated circuit chips 3a, 3b directly on the terminal electrodes disposed on the active substrate 2. The electric connection of the driving integrated circuit chips 3a, 3b is made by mounting the printed circuit board 13 on the active substrate 2 so that the openings 14a, 14b of thus composed printed circuit board 13 may be at positions corresponding to the mounting position of the driving integrated circuit chips 3a, 3b mounted on the active substrate 2.

The mounting method of the printed circuit board 13 on the active substrate 2 is not particularly limited, and, for example, it is fixed by heating while pressing by using the ACF 21.

However, in the case of using the ACF mounting method for mounting the printed circuit board 13, in order to not disconnect the already mounted driving integrated circuit chips 3a, 3b, it is preferred to mount the printed circuit board 13, while, for example, lowering the temperature when mounting the printed circuit board 13 or fixing the driving integrated circuit chip 3.

In such a constitution, since the wiring lines 23 of low resistance composed of thick conductive material formed on the printed circuit board 13 can be used as the bus lines such as power source lines, input signal lines or clock lines, it is not necessary to use the conventional long bus flexible film. Besides, since the resistance of the wiring lines 23 is low, signals can be transmitted at high speed without deforming the signal waveform.

External electric signals can be supplied, as shown in FIG. 1A, by disposing an external connection terminal 33 at a position not interfering mounting of the printed circuit board 13 at the peripheral edge of the active substrate 2 in the same way as in the prior art, or by mounting and connecting by using a Flexible Printed Circuit (FPC) by disposing an external connection terminal 34 on the principal surface opposite to the principal surface of the printed circuit board 13 facing the active substrate 2.

(Embodiment 2)

The foregoing embodiment 1 employs the printed circuit board 13 forming openings 14a, 14b at positions corresponding to the mounting positions of the driving integrated circuit chips 3a, 3b. In embodiment 2, it is intended to use a printed circuit board 13 having a deep recess 15 larger than the outside shape of the driving integrated circuit chips 3a, 3b, while covering the upper surface of the driving integrated circuit chips 3a, 3b mounted on the active substrate 2. This embodiment has the same effects as embodiment 1.

Also in this embodiment, in the same way as in embodiment 1, it is not necessary to use the conventional long bus flexible film, and the cost is lowered. In embodiment 1, however, thick wiring lines 22, 23 formed on both sides of the printed circuit board 13 had restrictions in the circuit-design in order to narrow the line width or decrease the number of lines near the opening 14. The printed circuit board 13 in embodiment 2 is, however, free from such restrictions so that the wiring lines 23 can be formed in the full width of the printed circuit board 13 on the principal surface opposite to the principal surface facing the active substrate 2.

In these embodiments and the following embodiments, in the constitution forming wiring lines 22, 23 on both sides of the printed circuit board 13, by using through-holes, the enhanced freedom of electric design of wiring lines in multilayer wiring and the reduction of wiring-resistance can be both achieved.

(Embodiment 3)

FIG. 3 explains embodiment 3 of the invention.

Figure 3A:
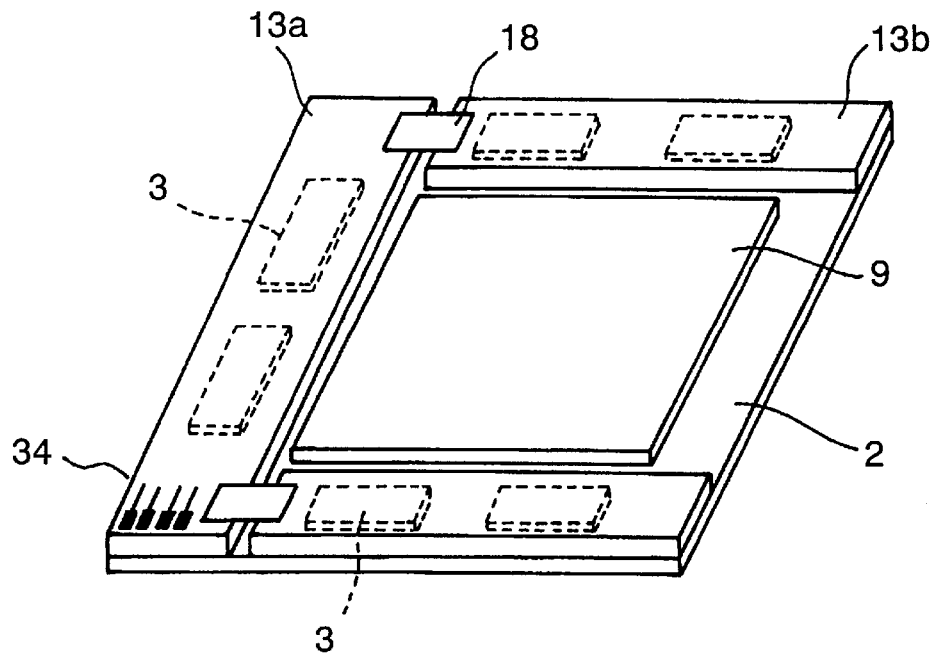
FIG. 3A is a perspective view showing a mounting state of a printed circuit board on a liquid crystal panel in embodiment 3 of the invention.
Figure 3B:
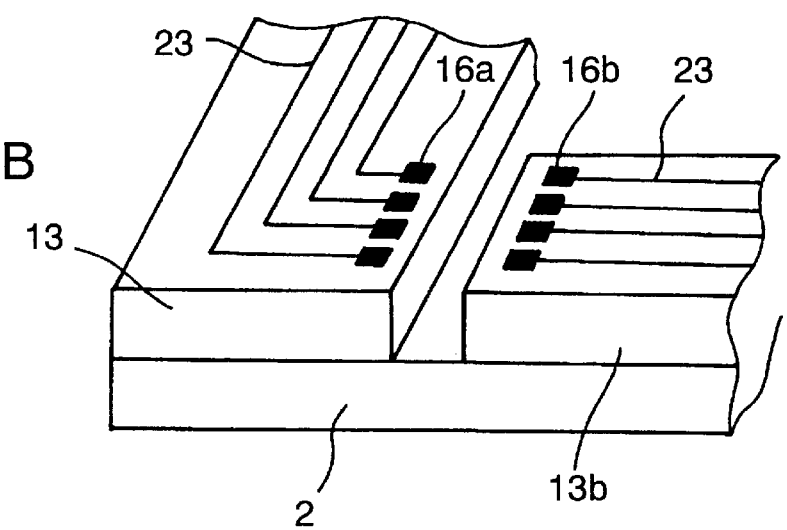
FIG. 3B is an essential magnified view showing the mounting state of the printed circuit board on the liquid crystal panel in embodiment 3 of the invention
Figure 3C:
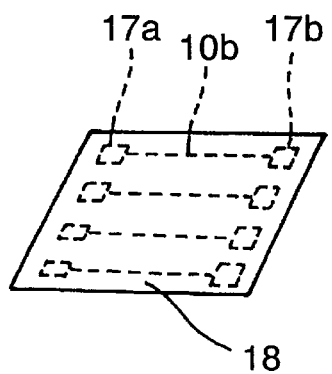
FIG. 3C is a perspective view of a connection film showing the mounting state of the printed circuit board on the liquid crystal panel in embodiment 3 of the invention.

FIG. 3A is a perspective view of the liquid crystal panel, FIG. 3B is its essential magnified view, and FIG. 3C shows a connection film for linking the split printed circuit boards together.

The foregoing embodiments 1 and 2 present the L-shaped or pi-shaped printed circuit board 13 integrating a printed circuit board connected to connection terminals of scanning lines and a printed circuit board connected to connection terminals of signal lines. Even when using such printed circuit board 13, in a small-sized liquid crystal panel of size 3 (diagonal 7.5 cm) or smaller, the expansion difference between the printed circuit board 13 and active substrate 2 is small due to temperature rise when mounting the printed circuit board 13, and the material cost and processing cost of the printed circuit board 13 are small, and there is little problem.

Generally, however, as the screen size is larger (the display capacity also increases), in the active substrate, the number of terminals increases and the length is extended at both the disposing side of connection terminals of scanning lines (called scanning line side) and the disposing side of connection terminals of signal lines (called signal line side). Therefore, the length of the printed circuit board 13 is extended, which makes it difficult to use the one-piece type printed circuit board 13.

Therefore, in embodiment 3, the printed circuit board 13 forming a recess 15 at a position corresponding to the mounting position of the driving integrated circuit chip 3 in the same manner as in embodiment 2 is split into the scanning line side and the signal line side as shown in FIG. 3A.

For connection between the scanning line side printed circuit board 13a and the signal line side printed circuit board 13b, as shown in FIG. 3B, connection terminals 16a, 16b are formed on the upper surfaces of the both printed circuit boards, and these two groups of connection terminals are connected, as shown in FIG. 3C, by using a flexible connection film 18 connected by a conductive wiring line 10b, for example, between connection terminals 17a and 17b.

The connection method of the connection film 18 to the printed circuit boards 13a, 13b is not specified. In such constitution, handling is easy if using a very slender printed circuit board 13 is used. Since handling is easy, if the number of parts is increased, and the number of mounting steps and mounting cost are increased by dividing the printed circuit board, sufficient effects for compensating for such demerits are obtained. Accordingly, not only mounting of printed circuit board on the active substrate 2 is easier, but also the total cost is lowered.

(Embodiment 4)

FIG. 4 shows embodiment 4 of the invention.

Figure 4A:
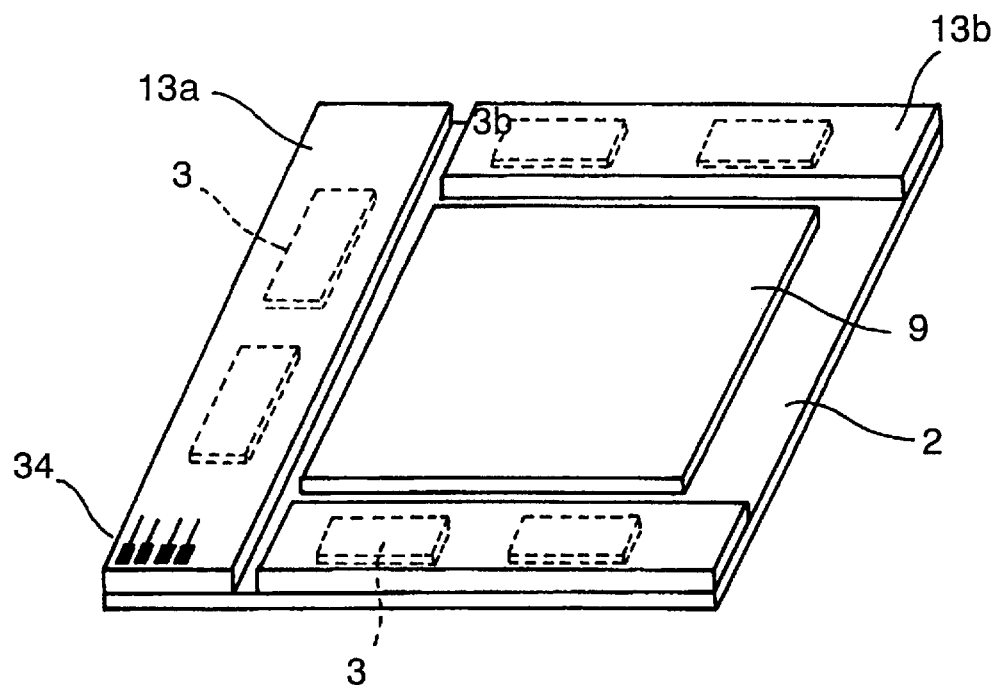
FIG. 4A is a perspective view showing a mounting state of a printed circuit board on a liquid crystal panel in embodiment 4 of the invention.
Figure 4B:
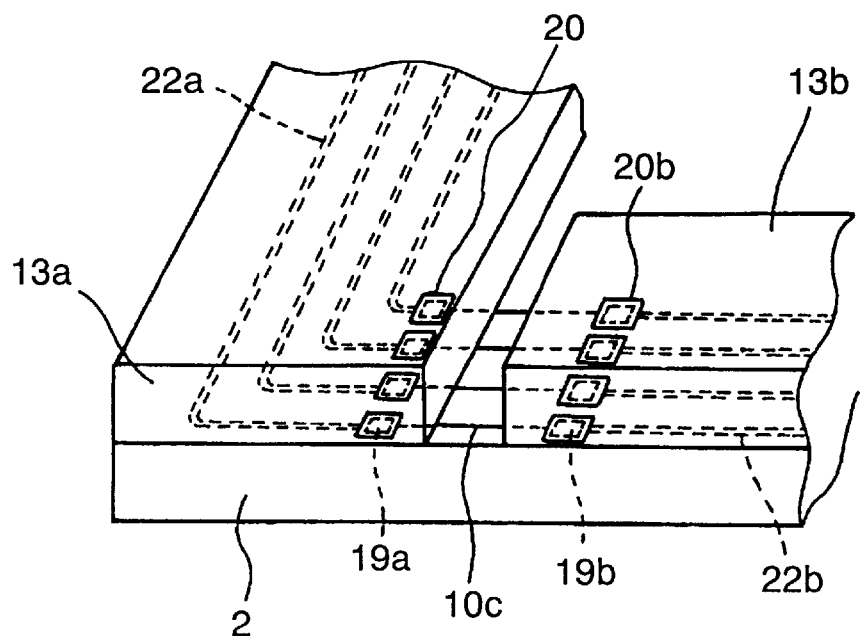
FIG. 4B is an essential magnified view showing the mounting state of the printed circuit board on the liquid crystal panel in embodiment 4 of the invention.

FIG. 4A is a perspective view of liquid crystal panel, and FIG. 4B is a magnified view of essential parts thereof.

In embodiment 4, the connection method of the printed circuit board 13 divided into the scanning line side and signal line side is different from that in embodiment 3, but other basic constitution is nearly in the same manner as in embodiment 3.

As shown in FIG. 4A, the printed circuit board 13 forming a recess 15 at a position corresponding to the mounting position of the driving integrated circuit chip 3 is split into the scanning line side and signal line side in the same way as in embodiment 2.

For connecting between the scanning line side printed circuit board 13a and the signal line side printed circuit board 13b, in a different way from embodiment 3, connection film 18 is not used.

More specifically, as shown in FIG. 4B, in the outer peripheral margin of the image display area of the active substrate 2, bus lines 10c of power source lines, input signal lines and clock lines are disposed together with connection terminals 19a, 19b, and on the principal surface facing the active substrate 2 of the printed circuit boards 13a, 13b, bus lines 22a, 22b of power source lines, input signal lines and clock lines are disposed together with connection terminals 20a, 20b, and the printed circuit boards 13a, 13b are mounted on the active substrate 2 and connected together.

Since these bus lines 10c for connecting between the two printed circuit boards 13a, 13b are short in distance, herein, the voltage drop due to the resistance can be ignored.

Such a constitution can solve the problems of degradation of mounting precision, unevenness of connecting resistance and deterioration of reliability due to the dimensional precision of the printed circuit board 13 or the difference in thermal expansion coefficients between the glass substrate 2 and printed circuit board 13, which occurred conventionally in a large screen sized liquid crystal panel of which one side is more than 10 cm.

In embodiment 3, the overall thickness is increased by the portion of the thickness of the flexible connection film 18, but in embodiment 4, since connection film 18 is not used, an increase of overall thickness can be suppressed.

(Embodiment 5)

Figure 5:
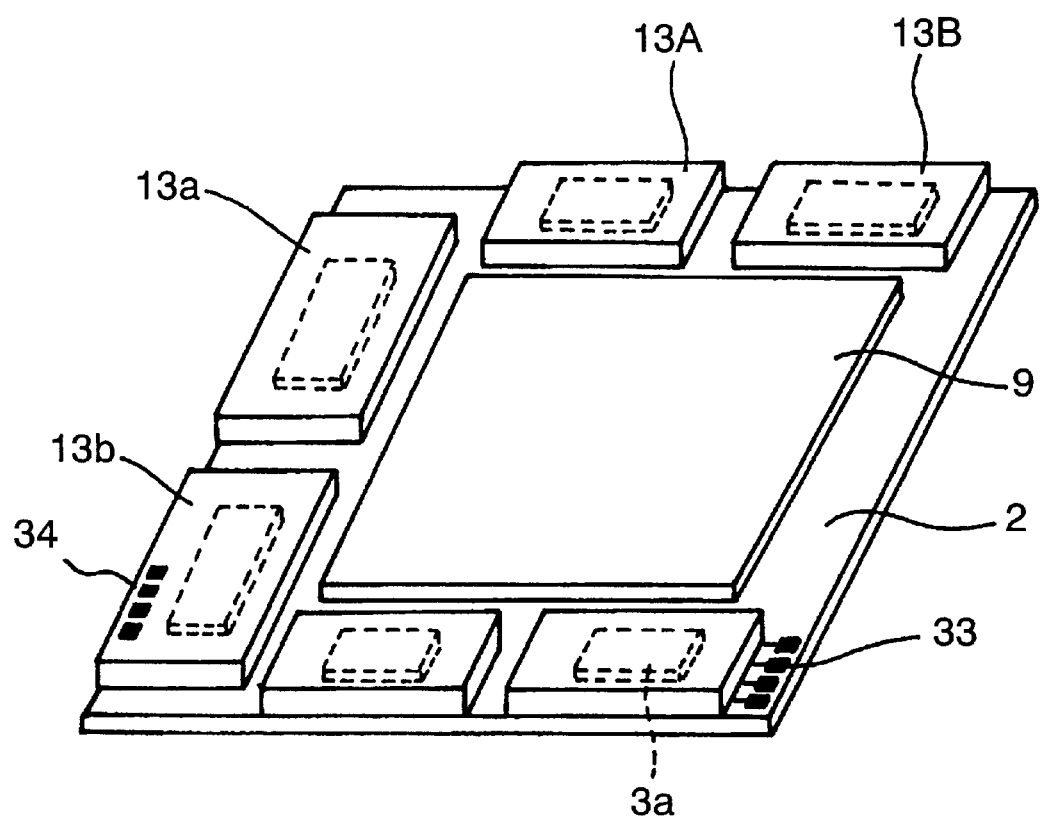
FIG. 5 is a perspective view showing a mounting state of a printed circuit board on a liquid crystal panel in embodiment 5 of the invention.

FIG. 5 explains embodiment 5 of the invention.

The printed circuit board 13 is divided into a plurality of pieces each at the scanning line side and signal line side, which is different from embodiment 3 and embodiments 4, but other basic constitution is nearly in the same manner as in embodiment 2.

That is, as shown in FIG. 5, the printed circuit board each at the scanning line side and signal line side is divided into a plurality of pieces (that is, the scanning line side is divided into 13a, 13b, . . . , and the signal line side into 13A, 13B, . . . ).

The divided printed circuit boards are connected together same as in embodiment 4, that is, bus lines 10c as described above such as power source lines, input signal lines and clock lines are disposed together with connection terminals 19a, 19b between the integrated circuit chips 3a and 3b adjacent to each other in the mounting region outside of the image display area of the active substrate 2. Bus lines 22a, 22b such as power source lines, input signal lines and clock lines are disposed together with connection terminals 20a, 20b on the principal surface of the printed circuit boards 13a, 13b facing the active substrate 2. Thus the printed circuit boards 13a, 13b are mounted on the active substrate 2 and are connected together.

Thus, by forming the bus lines and connection terminals for connecting the split printed circuit boards on a principal surface of the active substrate, it is easy to mount the printed circuit board on the active substrate, in particular, in the display panel of large screen size.

In this embodiment 5, too, there are two choices for connecting external circuits and bus lines such as power source lines, input signal lines and clock lines. The overall thickness does not increase when an external connection terminal 33 is formed on the active substrate 2 in the same manner as in the prior art. When the printed circuit board 13 is divided into a plurality of pieces to be disposed, the size of the printed circuit board 13 needs to be changed depending on the forming position of the connection terminal.

A connection terminal 34 may be formed on a principal surface at the opposite side of the surface of the printed circuit board 13 facing the active substrate 2. In this case, it is not necessary to change the size if the printed circuit board is divided into a plurality of pieces, but an external connection terminal 34 for connecting with an external circuit needs to be formed in any one of the printed circuit boards.

Further, embodiment 5 brings about the following effects.

The material loss is less when fabricating the printed circuit board, so that the cost is saved. The expansion difference between the printed circuit board and the active substrate due to heating when mounting the printed circuit board is absorbed, so that the mounting process is easy. Further, the precision of the mounting process is enhanced.

The foregoing embodiments 3 to 5 relate to the printed circuit board 13 forming the recess 15 at the position corresponding to the mounting position of the driving integrated circuit 3 in embodiment 2, but the invention is not limited to this structure alone, but the same effects are obtained in the printed circuit board 13 in embodiment 1 in which the opening 14 is formed at a position corresponding to the mounting position of the driving integrated circuit 3.

The foregoing embodiments 1 to 5 relate to examples of active type color liquid crystal panel, but the invention is not limited to this type alone, but the same effects are obtained in the IPS type liquid crystal panel not requiring transparent conductive pixel electrodes, the simple type liquid crystal panel not incorporating an active element, or the reflection type liquid crystal panel whether of active type or of simple type.

The same effects are also obtained in the liquid crystal panel forming coloring layers for a color display on the active substrate.

Further, in the illuminated matrix panel such as PDP (plasma display panel) or EL (electroluminescent) panel, terminal electrodes for mounting are disposed on a principal surface in the peripheral margin of one glass substrate, and electric signals are supplied from the driving integrated circuit to scanning lines and signal lines by some connecting means, and in this respect they are the same as the liquid crystal panel of the invention. Thus the same effects as in embodiments 1 to 5 can be obtained. It is because, in these display devices, too, terminal electrodes for mounting are disposed on a principal surface in the peripheral margin of one glass substrate, and electric signals are supplied from the driving integrated circuit to scanning lines and signal lines by some connecting means.

INDUSTRIAL APPLICABILITY

Thus, according to the liquid crystal panel of the invention, a printed circuit board having a deeper recess than the thickness of a driving semiconductor chip, or a printed circuit board having a larger opening than the outside diameter of the driving semiconductor chip is mounted over the driving semiconductor chip mounted on an active substrate. At this time, wiring lines of low resistance formed on the printed circuit board can be used as bus lines, and the printed circuit board forming wiring lines required to have a low wiring resistance such as power source lines, input signal lines and clock lines can be mounted on the active substrate over each driving integrated circuit chip. Therefore, the mounting cost can be lowered, and the connection around the liquid crystal panel is simplified, so that the reliability of the apparatus can be further enhanced.

Further, by disposing thus composed printed circuit board by dividing into the scanning line side and signal line side, it is easier to handle, and the material loss is less when fabricating the printed circuit board, so that a significant cost saving effect is obtained.

The invention is not limited to the active type color liquid crystal panel alone, and, it is applicable, for example, in the IPS type liquid crystal panel not requiring transparent conductive pixel electrodes, or in the simple type liquid crystal panel not incorporating any active elements, and in the reflection type liquid crystal panel whether of active type or of simple type. The invention is also effective in the color liquid crystal panel forming the coloring layers for color display on the active substrate, not on the counter substrate.

The same effects are obtained in the PDP, EL and other illuminated matrix panels.

What is claimed is:

1. A display panel including a liquid crystal panel, said liquid crystal panel comprising:
   an active substrate having
      a plurality of scanning lines,
      a plurality of signal lines substantially orthogonal to the scanning lines sandwiching at least one insulation layer,
      at least one switching element and at least one pixel electrode at every intersection of the scanning lines and the signal lines, which are all formed on a principal surface of a first transparent insulating substrate, and
      a terminal electrode of the scanning lines and the signal lines formed outside of an image display area of the active substrate; and
   a liquid crystal filled between a second transparent insulating substrate or a color filter substrate forming a color filter layer, which are having a transparent conductive layer on a principal surface and facing said active substrate,
   wherein electric signals are supplied to terminal electrodes of the scanning lines and the signal lines by mounting a driving integrated circuit chip directly on the terminal electrode disposed on the active substrate, and
   an electric connection to the driving integrated circuit chip is achieved by mounting a printed circuit board having a larger opening than the outside shape of the driving integrated circuit chip and forming wiring lines at the mounting position of the driving integrated circuit chip mounted on the active substrate and its vicinity, outside of the image display area of the active matrix substrate.

2. The display panel of claim 1, wherein said printed circuit board mounted outside of the image display area is formed of a same printed circuit board as the printed circuit board also in a portion corresponding to the opening, and covers an upper surface of the driving integrated circuit chip, and
   a recess deeper and larger than the outside shape of the driving integrated circuit chip is formed around the driving integrated circuit chip.

3. The display panel of claim 1, wherein
   the printed circuit board is disposed as being divided into a portion at which the terminal electrode of the scanning lines of the active substrate is disposed and a portion at which the terminal electrode of the signal lines of the active substrate is disposed, and
   a connection terminal for mutually connecting the divided printed circuit boards is formed on the upper surface of the printed circuit board.

4. The display panel of claim 1, wherein
   the printed circuit board is disposed as being divided into a portion at which the terminal electrode of the scanning lines of the active substrate is disposed and a portion at which the terminal electrode of the signal lines of the active substrate is disposed, and
   wiring lines and connection terminals for mutually connecting the divided printed circuit boards are formed at a mounting surface side of the active substrate.

5. The display panel of claim 1, wherein
   the printed circuit board is disposed as being divided into a plurality of pieces each disposed at a portion at which the terminal electrode of the scanning lines of the active substrate is disposed and a portion at which the terminal electrode of the signal lines of the active substrate is disposed, and
   wiring lines and connection terminals for mutually connecting the divided printed circuit boards are formed on a principal surface of the active substrate.

6. A display panel comprising;
   a plurality of scanning lines;
   a plurality of signal lines substantially orthogonal to the scanning lines;
   a terminal electrode of the scanning lines formed outside of an image display area; and
   a terminal electrode of the signal lines formed outside of the image display area,
   wherein electric signals are supplied to the terminal electrode of the scanning lines and the signal lines by mounting a driving integrated circuit chip directly on the terminal electrode, and
   electric connection to the driving integrated circuit chip is achieved by mounting a printed circuit board having a larger opening than the outside shape of the driving integrated circuit chip and forming wiring lines at a mounting position of the driving integrated circuit chip and its vicinity, outside of the image display area.

7. The display panel of claim 6, wherein said printed circuit board mounted outside of the image display area is formed of a same printed circuit board as the printed circuit board also in a portion corresponding to the opening, and covers an upper surface of the driving integrated circuit chip, and a recess deeper and larger than the outside shape of the driving integrated circuit chip is formed around the driving integrated circuit chip.

8. The display panel of claim 6, wherein the printed circuit board is disposed as being divided into a portion at which the terminal electrode of the scanning lines of the display panel is disposed and a portion at which the terminal electrode of the signal lines of the display panel is disposed, and a connection terminal for mutually connecting the divided printed circuit boards is formed on the upper surface of the printed circuit board.

9. The display panel of claim 6, wherein the printed circuit board is disposed as being divided into a portion at which the terminal electrode of the scanning lines of the display panel is disposed and a portion at which the terminal electrode of the signal lines of the display panel is disposed, and wiring lines and connection terminals for mutually connecting the divided printed circuit boards are formed at a mounting surface side of one of the substrates for forming the display panel.

10. The display panel of claim 6, wherein the printed circuit board is disposed as being divided into a plurality of pieces each disposed at a portion at which the terminal electrode of the scanning lines of the display panel is disposed and a portion at which the terminal electrode of the signal lines of the display panel is disposed, and wiring lines and connection terminals for mutually connecting the divided printed circuit boards are formed on a principal surface of one of the substrates for forming the display panel.

11. The display panel of any one of claim 6, wherein said display panel is any one of an in-plain-switching (IPS) type liquid crystal panel not requiring transparent conductive pixel electrode, a simple matrix type liquid crystal panel not incorporating active element, a reflection type liquid crystal panel including active matrix type and simple matrix type, and a liquid crystal panel forming coloring layers for color display on an active matrix substrate.

12. The display panel of any one of claim 6, wherein said display panel is an illuminated matrix panel including PDP and EL type.

* * * * *